(12) United States Patent
Hamamoto

(10) Patent No.: US 10,877,095 B2
(45) Date of Patent: Dec. 29, 2020

(54) POWER STORAGE SYSTEM

(71) Applicant: Panasonic Intellectual Property Management Co., Ltd., Osaka (JP)

(72) Inventor: Katsuaki Hamamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 58 days.

(21) Appl. No.: 16/326,314

(22) PCT Filed: Sep. 4, 2017

(86) PCT No.: PCT/JP2017/031698
§ 371 (c)(1),
(2) Date: Feb. 18, 2019

(87) PCT Pub. No.: WO2018/047752
PCT Pub. Date: Mar. 15, 2018

(65) Prior Publication Data
US 2019/0204388 A1 Jul. 4, 2019

(30) Foreign Application Priority Data
Sep. 7, 2016 (JP) ................................ 2016-175000

(51) Int. Cl.
*G01R 31/327* (2006.01)
*H02H 7/18* (2006.01)
(Continued)

(52) U.S. Cl.
CPC ... *G01R 31/3275* (2013.01); *G01R 19/16528* (2013.01); *H01M 10/441* (2013.01);
(Continued)

(58) Field of Classification Search
CPC ......... G01R 31/3275; G01R 19/16528; H01M 10/441; H01M 10/44
See application file for complete search history.

(56) References Cited

U.S. PATENT DOCUMENTS 8,085,515 B2 * 12/2011 Yugou ................. H01H 47/002
361/23
10,516,189 B2 * 12/2019 Loftus ................. H01M 10/425
(Continued)

FOREIGN PATENT DOCUMENTS

JP 2007-165253 6/2007
JP 2013-219955 10/2013

OTHER PUBLICATIONS

International Search Report of PCT application No. PCT/JP2017/031698 dated Nov. 7, 2017.

*Primary Examiner* — Christopher E Mahoney
(74) *Attorney, Agent, or Firm* — McDermott Will & Emery LLP

(57) ABSTRACT

In a power storage system, a first switch is connected between a first node and a second node. The first node is connected to a positive terminal of a power storage unit, and the second node is connected to a positive terminal of a load. A second switch is connected between a third node and a fourth node. The third node is connected to a negative terminal of the power storage unit, and the fourth node is connected to a negative terminal of the load. A first comparator circuit compares a first voltage based on a voltage between the first and fourth nodes with a first reference voltage. A second comparator circuit compares a second voltage based on a voltage between the second and third nodes with a second reference voltage.

5 Claims, 12 Drawing Sheets

(51) Int. Cl.
  H02H 7/00 (2006.01)
  G01R 19/165 (2006.01)
  H01M 10/44 (2006.01)
  H01M 10/48 (2006.01)
  H03K 5/24 (2006.01)

(52) U.S. Cl.
  CPC ............... H02H 7/00 (2013.01); H02H 7/18 (2013.01); *H01M 10/44* (2013.01); *H01M 10/48* (2013.01); *H03K 5/24* (2013.01)

(56) References Cited

U.S. PATENT DOCUMENTS

| | | |
|---|---|---|
| 2007/0139005 A1 | 6/2007 | Osawa |
| 2012/0181988 A1* | 7/2012 | Uchibori ............... H01M 2/348 320/134 |
| 2016/0254809 A1* | 9/2016 | Mochizuki .......... H01L 27/0207 320/112 |

* cited by examiner

POWER STORAGE SYSTEM

CROSS-REFERENCE TO RELATED APPLICATIONS

This application is a U.S. national stage application of the PCT International Application No. PCT/JP2017/031698 filed on Sep. 4, 2017, which claims the benefit of foreign priority of Japanese patent application No. 2016-175000 filed on Sep. 7, 2016, the contents all of which are incorporated herein by reference.

TECHNICAL FIELD

The present invention relates to a power storage system including a storage battery.

BACKGROUND ART

In general, a positive-electrode relay, a negative-electrode relay, and a pre-charge relay are disposed between a storage battery and a load. PTL 1 discloses a power storage system that measures voltages on a storage battery, a load, and other components and determines the presence or absence of failure in a positive-electrode relay, a negative-electrode relay, or a pre-charge relay on the basis of measured voltage values.

CITATION LIST

Patent Literature

PTL 1: Unexamined Japanese Patent Publication No. 2013-219955

SUMMARY OF THE INVENTION

Generally, technology for detecting failure using measured voltage values, as is disclosed in PTL 1, requires an isolator circuit that isolates a voltage measurement circuit and a controlling circuit to transmit data about measured voltage values to the controlling circuit. The isolator circuit needs to isolate analog data about measured values or digital data about measured values that have been converted from analog to digital. Unfortunately, development of storage batteries with higher voltage has created difficulty in implementing isolator circuits as well as voltage measurement circuits, resulting in increased cost.

In consideration of such circumstances, it is an object of the present invention to provide a technique that enables a system to determine the presence or absence of failure while avoiding an increase in cost.

A power storage system according to an aspect of the present invention, accomplished to solve the problem mentioned above, includes a power storage unit, a first switch connected between a first node and a second node, and a second switch connected between a third node and a fourth node. The first node is connected to a positive terminal of the power storage unit, and the second node is connected to a positive terminal of a load. The third node is connected to a negative terminal of the power storage unit, and the fourth node is connected to a negative terminal of the load. The power storage system further includes a first comparator circuit that compares a first voltage based on a voltage between the first and the fourth nodes with a first reference voltage and a second comparator circuit that compares a second voltage based on a voltage between the second and the third nodes with a second reference voltage.

The present invention enables the power storage system to determine the presence or absence of failure while avoiding an increase in cost.

DESCRIPTION OF EMBODIMENTS

First Exemplary Embodiment

Figure 1:
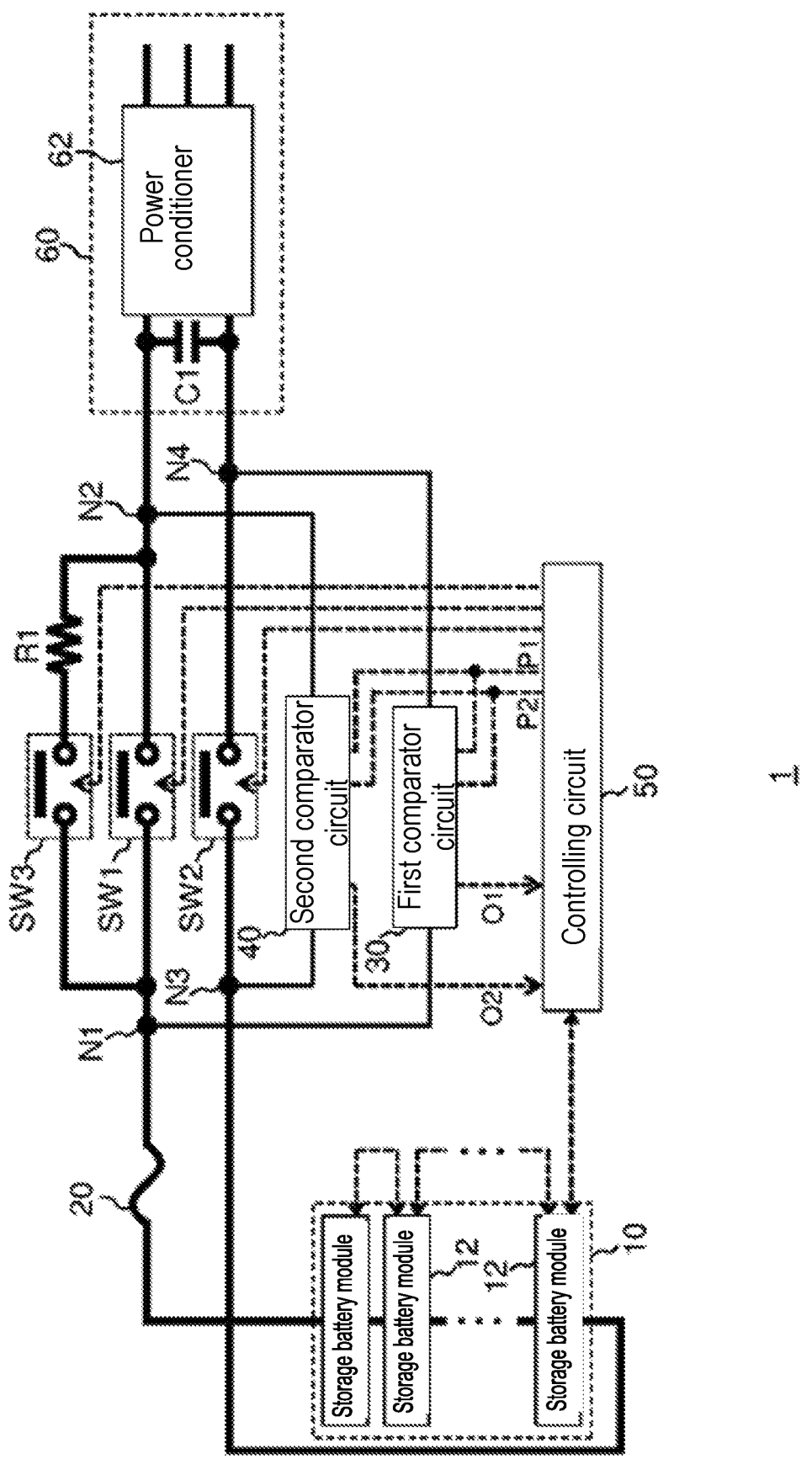
FIG. 1 is a block diagram illustrating a configuration of a power storage system according to a first exemplary embodiment.

FIG. 1 is a block diagram illustrating a configuration of power storage system 1 according to a first exemplary embodiment. Power storage system 1 can be installed, for example, in a vehicle such as a hybrid vehicle or an electric vehicle to serve as a driving power source for the vehicle. Power storage system 1 includes power storage unit 10, fuse 20, positive-electrode contactor (first switch) SW1, negative-electrode contactor (second switch) SW2, pre-charge contactor (third switch) SW3, resistor R1, first comparator circuit 30, second comparator circuit 40, controlling circuit 50, and load 60.

Power storage unit 10 includes a plurality of storage battery modules 12 connected in series. Storage battery module 12 has a plurality of battery cells that are connected in series and each of which is a chargeable and dischargeable secondary battery. The plurality of storage battery modules 12 can each communicate. Fuse 20 is connected between a positive terminal of power storage unit 10 and first node N1 and is configured to shut off abnormal electric current.

Positive-electrode contactor SW1 is connected between first node N1 and second node N2. First node N1 is connected to the positive terminal of power storage unit 10, and second node N2 is connected to a positive terminal of load 60. Under control of controlling circuit 50, positive-electrode contactor SW1 is turned on to close between first and second nodes N1 and N2 and is turned off to open between these nodes.

Negative-electrode contactor SW2 is connected between third node N3 and fourth node N4. Third node N3 is connected to a negative terminal of power storage unit 10, and fourth node N4 is connected to a negative terminal of load 60. Under control of controlling circuit 50, negative-electrode contactor SW2 is turned on to close between third and fourth nodes N3 and N4 and is turned off to open between these nodes.

Pre-charge contactor SW3 is disposed between first and second nodes N1 and N2 and is connected in parallel with positive-electrode contactor SW1. Resistor R1 is inserted between pre-charge contactor SW3 and second node N2 to limit electric currents flowing while pre-charge contactor SW3 is turned on. Resistor R1 may be inserted between pre-charge contactor SW3 and first node N1. Under control of controlling circuit 50, pre-charge contactor SW3 is turned on to close between first node N1 and resistor R1 and is turned off to open between first node N1 and resistor R1. Pre-charge contactor SW3 and resistor R1 constitute a pre-charge circuit that pre-charges capacitor C1 in load 60 described later.

First comparator circuit 30 compares first voltage V1 based on a voltage between first and fourth nodes N1 and N4 with a first reference voltage. First voltage V1 is a division of the voltage between first and fourth nodes N1 and N4. First comparator circuit 30 outputs high-level comparison result O1 if first voltage V1 is the first reference voltage or higher and outputs low-level comparison result O1 if first voltage V1 is less than the first reference voltage.

Second comparator circuit 40 compares second voltage V2 based on a voltage between second and third nodes N2 and N3 with a second reference voltage. Second voltage V2 is a division of the voltage between second and third nodes N2 and N3. Second comparator circuit 40 outputs high-level comparison result O2 if second voltage V2 is the second reference voltage or higher and outputs low-level comparison result O2 if second voltage V2 is less than the second reference voltage.

Figure 2:
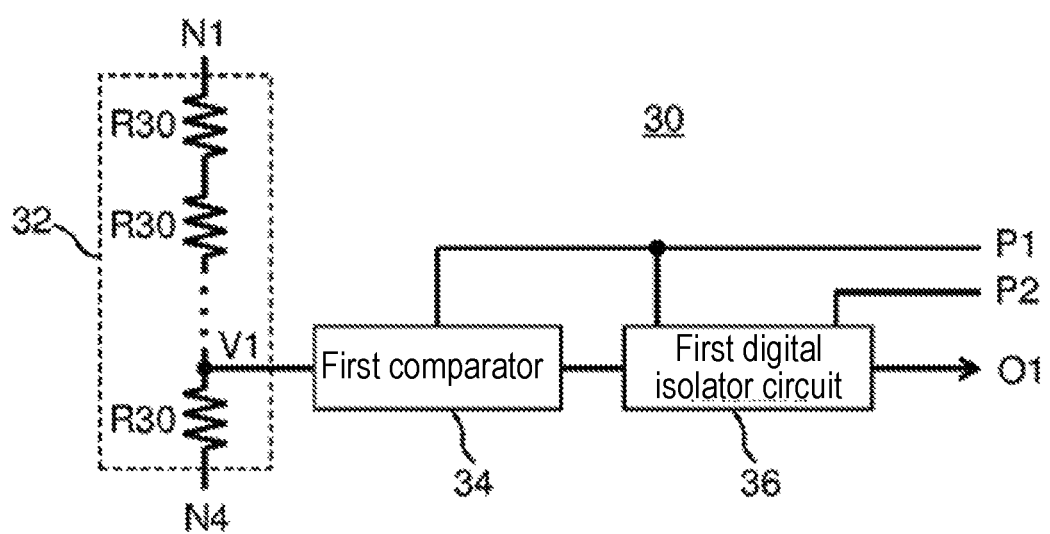
FIG. 2 is a block diagram illustrating a configuration of a first comparator circuit in FIG. 1.

FIG. 2 is a block diagram illustrating a configuration of first comparator circuit 30 in FIG. 1. First comparator circuit 30 has voltage dividing resistor 32, first comparator 34, and first digital isolator circuit 36. Voltage dividing resistor 32 has a plurality of resistors R30 connected in series between first and fourth nodes N1 and N4. The plurality of resistors R30 enables voltage dividing resistor 32 to output first voltage V1, that is, a division of the voltage between first and fourth nodes N1 and N4.

First comparator 34 operates on isolated supply power P1, compares first voltage V1 with the first reference voltage, and outputs 1-bit digital data representing a comparison result. First digital isolator circuit 36 operates on isolated supply power P1 and non-isolated supply power P2 that is electrically isolated from isolated supply power P1 and outputs digital data sent from first comparator 34 as comparison result O1 to controlling circuit 50. Comparison result O1 is digital data isolated from digital data sent from first comparator 34.

Figure 3:
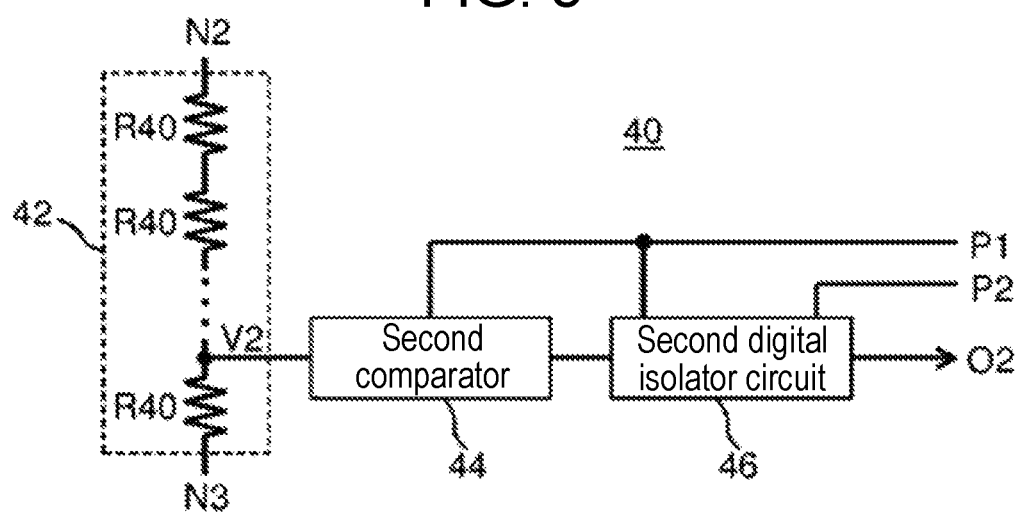
FIG. 3 is a block diagram illustrating a configuration of a second comparator circuit in FIG. 1.

FIG. 3 is a block diagram illustrating a configuration of second comparator circuit 40 in FIG. 1. Second comparator circuit 40 has voltage dividing resistor 42, second comparator 44, and second digital isolator circuit 46. Voltage dividing resistor 42 has a plurality of resistors R40 connected in series between third and second nodes N3 and N2. The plurality of resistors R40 enables voltage dividing resistor 42 to output second voltage V2, that is, a division of the voltage between third and second nodes N3 and N2.

Second comparator 44 operates on isolated supply power P1, compares second voltage V2 with the second reference voltage, and outputs 1-bit digital data representing a comparison result. Second digital isolator circuit 46 operates on isolated supply power P1 and non-isolated supply power P2 and outputs digital data sent from second comparator 44 as comparison result O2 to controlling circuit 50. Comparison result O2 is digital data isolated from digital data sent from second comparator 44.

With reference back to FIG. 1, controlling circuit 50 controls positive-electrode contactor SW1, negative-electrode contactor SW2, and pre-charge contactor SW3 and determines the presence or absence of failure in each of positive-electrode contactor SW1, negative-electrode contactor SW2, and pre-charge contactor SW3 based on whether or not comparison result O1 from first comparator circuit 30 and comparison result O2 from second comparator circuit 40 agree with respective expected values.

Specifically, controlling circuit 50 puts positive-electrode contactor SW1, negative-electrode contactor SW2, and pre-charge contactor SW3 into an off state and determines that negative-electrode contactor SW2 is welded if comparison result O1 from first comparator circuit 30 shows first voltage V1 higher than or equal to the first reference voltage (in other words, high-level comparison result O1). While these contactors are in the off state, controlling circuit 50 determines that negative-electrode contactor SW2 is not welded if first voltage V1 is less than the first reference voltage (in other words, low-level comparison result O1). The expected value in the same state is a low-level value.

Controlling circuit 50 puts positive-electrode contactor SW1, negative-electrode contactor SW2, and pre-charge contactor SW3 into the off state and determines that positive-electrode contactor SW1 or pre-charge contactor SW3 is welded if comparison result O2 from second comparator circuit 40 shows second voltage V2 higher than or equal to the second reference voltage (in other words, high-level comparison result O2). While these contactors are in the off state, controlling circuit 50 determines that each of positive-electrode contactor SW1 and pre-charge contactor SW3 is not welded if second voltage V2 is less than the second reference voltage (in other words, low-level comparison result O2). The expected value in the same state is a low-level value.

Controlling circuit 50 puts positive-electrode contactor SW1 and pre-charge contactor SW3 into the off state and negative-electrode contactor SW2 into an on state, and determines that negative-electrode contactor SW2 and fuse 20 are not faulty if comparison result O1 from first comparator circuit 30 shows first voltage V1 higher than or equal to the first reference voltage (in other words, high-level comparison result O1). While controlling circuit 50 controls these contactors to put them into the states above, controlling circuit 50 determines that negative-electrode contactor SW2 is in an open-contact failure or that fuse 20 is disconnected if first voltage V1 is less than the first reference voltage (in other words, low-level comparison result O1). The expected value in the states is a high-level value.

Controlling circuit 50 puts positive-electrode contactor SW1 and negative-electrode contactor SW2 into the off state and pre-charge contactor SW3 into the on state, and determines that pre-charge contactor SW3 is not faulty if comparison result O2 from second comparator circuit 40 shows second voltage V2 higher than or equal to the second reference voltage (in other words, high-level comparison result O2). While controlling circuit 50 controls these contactors to put them into the states above, controlling circuit 50 determines that pre-charge contactor SW3 is in an open-contact failure if second voltage V2 is less than the second reference voltage (in other words, low-level comparison result O2). The expected value in the states is a high-level value.

Controlling circuit 50 puts positive-electrode contactor SW1 into the on state and negative-electrode contactor SW2 and pre-charge contactor SW3 into the off state, and determines that positive-electrode contactor SW1 is not faulty if comparison result O2 from second comparator circuit 40 shows second voltage V2 higher than or equal to the second reference voltage (in other words, high-level comparison result O2). While controlling circuit 50 controls these contactors to put them into the states above, controlling circuit 50 determines that positive-electrode contactor SW1 is in an open-contact failure if second voltage V2 is less than the second reference voltage (in other words, low-level comparison result O2). The expected value in the states is a high-level value.

Second voltage V2 measured when positive-electrode contactor SW1 or pre-charge contactor SW3 is in the on state differs from second voltage V2 measured when positive-electrode contactor SW1 and pre-charge contactor SW3 are in the off state. Thus, the controlling circuit can determine that positive-electrode contactor SW1 or pre-charge contactor SW3 is faulty if comparison result O2 obtained through a comparison between second voltage V2 and the second reference voltage does not agree with the expected value.

First voltage V1 measured when negative-electrode contactor SW2 is in the on state differs from first voltage V1 measured when negative-electrode contactor SW2 is in the off state. Thus, the controlling circuit can determine that negative-electrode contactor SW2 is faulty if comparison result O1 obtained through a comparison between first voltage V1 and the first reference voltage does not agree with the expected value.

Controlling circuit 50 obtains voltages detected at the plurality of storage battery modules 12 of power storage unit 10 and calculates, on the basis of the obtained detection voltages, a detection voltage applied between the positive and the negative terminals of power storage unit 10, i.e. a system voltage. Controlling circuit 50 defines pre-charge determination time, i.e. a length of time supposed to be taken between the instant when negative-electrode contactor SW2 and pre-charge contactor SW3 are turned on and the instant when second voltage V2 reaches the second reference voltage, on the basis of the detection voltage on power storage unit 10, the second reference voltage, resistor R1, and capacitor C1.

Controlling circuit 50 determines whether or not pre-charging is properly performed on capacitor C1 based on a length of time having passed until second voltage V2 reaches the second reference voltage (in other words, a length of time required for comparison result O2 to reach a high level) after the turning-off of positive-electrode contactor SW1 and the turning-on of negative-electrode contactor SW2 and pre-charge contactor SW3, as well as the pre-charge determination time.

Controlling circuit 50 operates on the basis of non-isolated supply power P2. A configuration of controlling circuit 50 may be implemented by either cooperation of hardware and software resources or a hardware resource alone. Available hardware resources include analog elements, microcomputers, digital signal processors (DSPs), read-only memory (ROM), random-access memory (RAM), field-programmable gate arrays (FPGAs), and other large-scale integrated circuits (LSIs). The software resource may be a program or other firmware.

Load 60 includes capacitor C1 and power conditioner 62. Capacitor C1 is connected between second and fourth nodes N2 and N4. Capacitor C1 has relatively large electrostatic capacity to instantaneously supply a relatively large amount of electric power to power conditioner 62. Power conditioner 62 converts direct-current voltage applied between second and fourth nodes N2 and N4 into alternating-current (AC) voltage and supplies converted AC voltage to a device such as a motor (not shown in figures).

Figure 4:
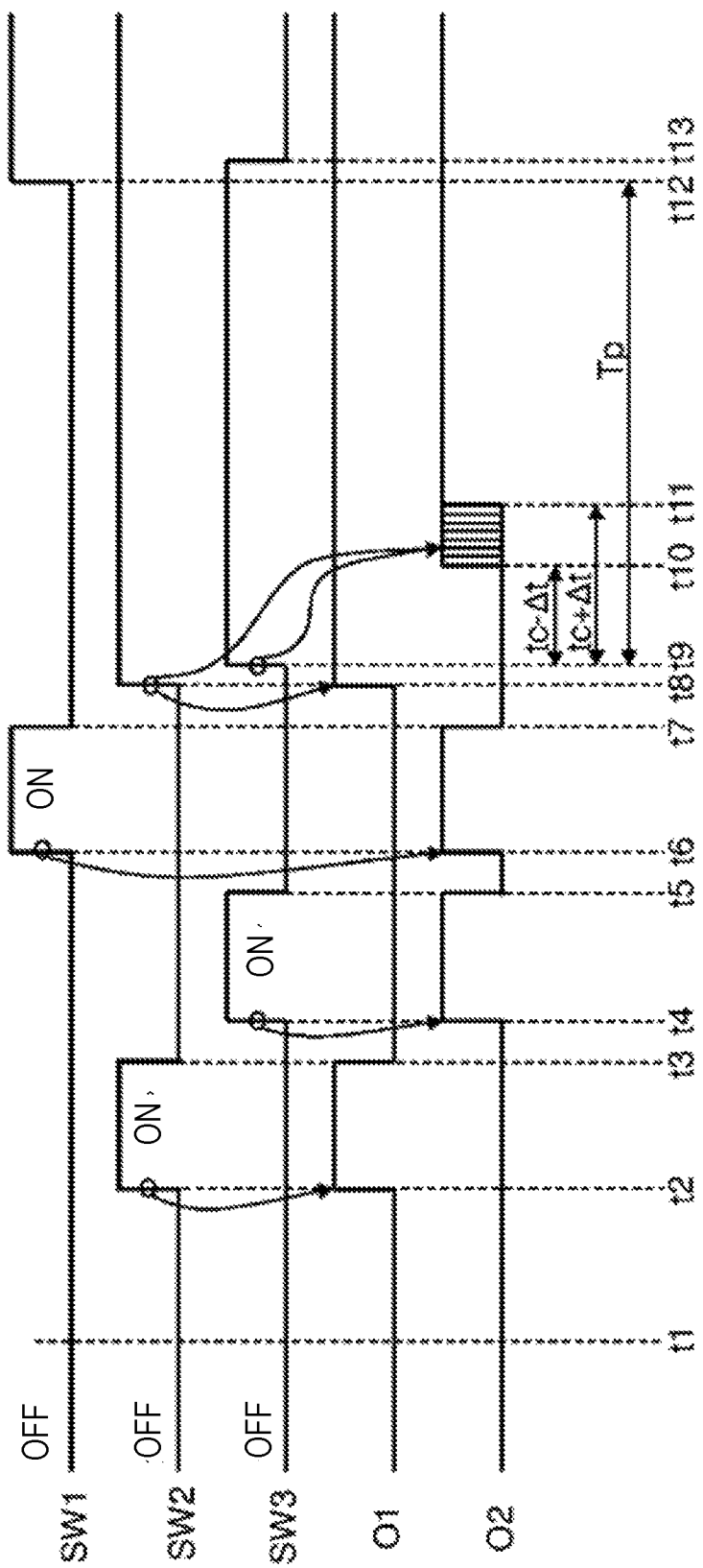
FIG. 4 is a timing chart illustrating an action performed by the power storage system of FIG. 1.

FIG. 4 is a timing chart illustrating an action performed by power storage system 1 of FIG. 1. FIG. 4 shows an action performed by power storage system 1 in which no component is faulty.

At time t1, comparison result O1 from first comparator circuit 30 and comparison result O2 from second comparator circuit 40 are low-level values while positive-electrode contactor SW1, negative-electrode contactor SW2, and pre-charge contactor SW3 are put in the off state. Thus, controlling circuit 50 determines that each of positive-electrode contactor SW1, negative-electrode contactor SW2, and pre-charge contactor SW3 is not welded.

At time t2, controlling circuit 50 puts negative-electrode contactor SW2 into the on state, and comparison result O1 from first comparator circuit 30 shows a high-level value. Thus, controlling circuit 50 determines that negative-electrode contactor SW2 is properly turned on and fuse 20 is not disconnected. At time t3, controlling circuit 50 puts negative-electrode contactor SW2 into the off state.

At time t4, controlling circuit 50 puts pre-charge contactor SW3 into the on state, and comparison result O2 from second comparator circuit 40 shows a high-level value. Thus, controlling circuit 50 determines that pre-charge contactor SW3 is properly turned on and is not faulty. At time t5, controlling circuit 50 puts pre-charge contactor SW3 into the off state.

At time t6, controlling circuit 50 puts positive-electrode contactor SW1 into the on state, and comparison result O2 from second comparator circuit 40 shows a high-level value. Thus, controlling circuit 50 determines that positive-electrode contactor SW1 is properly turned on and is not faulty. At time t7, controlling circuit 50 puts positive-electrode contactor SW1 into the off state.

Controlling circuit 50 puts negative-electrode contactor SW2 into the on state at time t8 and puts pre-charge contactor SW3 into the on state at time t9. Thereby, pre-charging starts. A period between times t9 and t10 is pre-charge determination time (tc−Δt), and a period between times t9 and t11 is pre-charge determination time (tc+4t). During a period between times t10 and t11, comparison result O2 from second comparator circuit 40 shows a high-level value. Thus, controlling circuit 50 determines that pre-charging is properly performed and the pre-charge circuit and capacitor C1 are not faulty.

Controlling circuit 50 puts positive-electrode contactor SW1 into the on state at time t12, when predetermined pre-charge time Tp has elapsed from time t9, and subsequently puts pre-charge contactor SW3 into the off state at time t13. The power storage system thereby finishes pre-charging and starts supplying electric power from power storage unit 10 to load 60 through positive- and negative-electrode contactors SW1 and SW2. Positive-electrode contactor SW1 is turned on after capacitor C1 is fully charged by pre-charging. This configuration averts excessive inrush current.

A process for defining pre-charge determination time will now be described.

Figure 5:
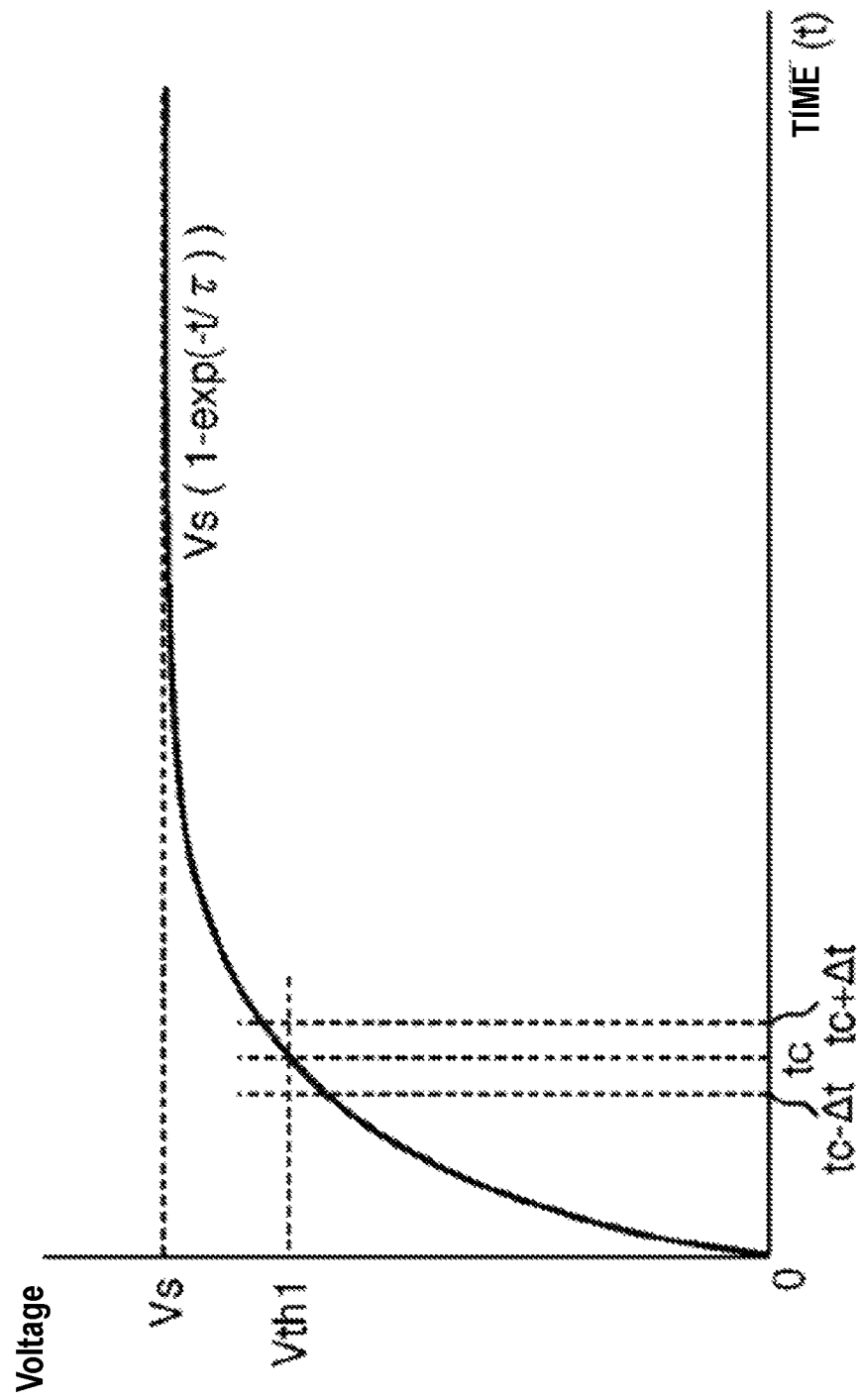
FIG. 5 is a graph illustrating changes in voltage at a second node in FIG. 1 over time during pre-charging.

FIG. 5 is a graph illustrating changes in voltage at second node N2 in FIG. 1 over time during pre-charging. With reference to FIG. 5, the voltage at second node N2 can be represented by Vs $(1-\exp(-t/\tau))$, with the proviso that time t=0 at the start of pre-charging, where Vs is the detection voltage on power storage unit 10, i.e. a system voltage, and $\tau$ is a time constant based on resistor R1 and capacitor C1.

If pre-charging is properly performed, time taken for second voltage V2, a divided voltage, to reach the second reference voltage equals time taken for the voltage at second node N2 to reach threshold voltage Vth1 corresponding to the second reference voltage. Accordingly, the power storage system calculates time taken for the voltage at second node N2 to reach threshold voltage Vth1. Threshold voltage Vth1 is a known quantity computed from the second reference voltage and a dividing ratio of voltage dividing resistor 42.

Controlling circuit 50 holds a plurality of normalized values in a table in advance. Each in the plurality of normalized values in the table is a value returned by the function in FIG. 5 at each time t on the condition that system voltage Vs=1. Controlling circuit 50 calculates a normalized threshold voltage, a value obtained by dividing threshold voltage Vth1 by system voltage Vs. Controlling circuit 50 retrieves a normalized value near the normalized threshold voltage from the table and defines pre-charge determination time (tc±Δt) by applying preset time width Δt to time tc corresponding to the normalized value retrieved from the table.

Figure 6:
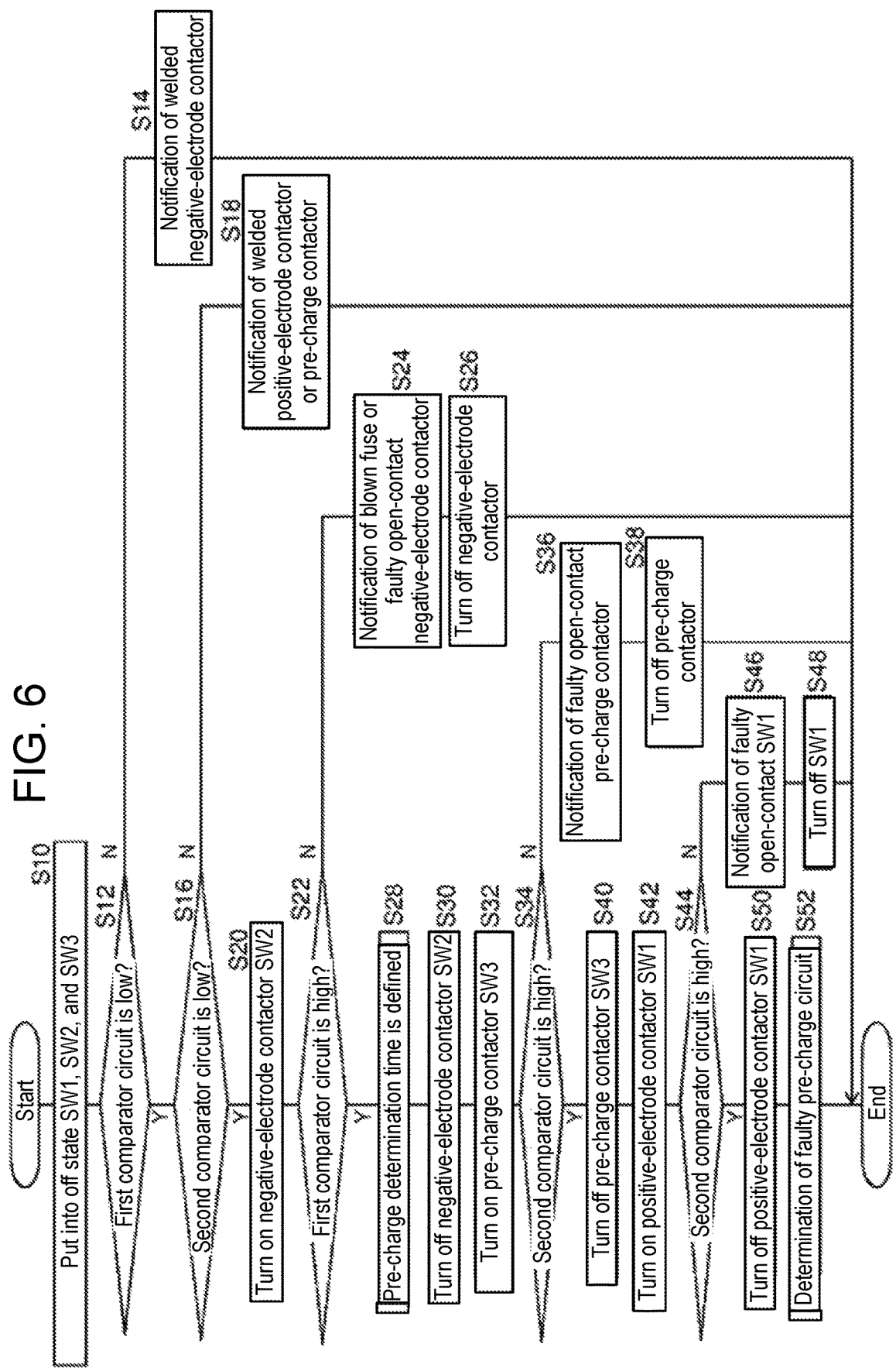
FIG. 6 is a flowchart illustrating a failure determination procedure performed by the power storage system of FIG. 1.

FIG. 6 is a flowchart illustrating a failure determination procedure performed by power storage system 1 of FIG. 1. The procedure of FIG. 6 is performed if an ignition switch in a vehicle (not shown) is turned on.

First, controlling circuit 50 puts positive-electrode contactor SW1, negative-electrode contactor SW2, and pre-charge contactor SW3 into the off state (S10). Controlling circuit 50 determines whether comparison result O1 from first comparator circuit 30 shows a low-level value (S12). If comparison result O1 is a high-level value (N in S12), controlling circuit 50 provides a notification of the welded negative-electrode contactor (S14) and ends the procedure. If comparison result O1 is a low-level value (Y in S12), controlling circuit 50 determines whether comparison result O2 from second comparator circuit 40 shows a low-level value (S16). If comparison result O2 is a high-level value (N in S16), controlling circuit 50 provides a notification of the welded positive-electrode contactor or of the welded pre-charge contactor (S18) and ends the procedure.

If comparison result O2 is a high-level value (Y in S16), controlling circuit 50 puts negative-electrode contactor SW2 into the on state (S20) and determines whether comparison result O1 from first comparator circuit 30 shows a high-level value (S22). If comparison result O1 is a low-level value (N in S22), controlling circuit 50 provides a notification of the blown fuse or of the faulty open-contact negative-electrode contactor (S24), puts negative-electrode contactor SW2 into the off state (S26), and ends the procedure. If comparison result O1 is a high-level value (Y in S22), controlling circuit 50 defines pre-charge determination time (S28).

Next, controlling circuit 50 puts negative-electrode contactor SW2 into the off state (S30) and pre-charge contactor SW3 into the on state (S32), and determines whether comparison result O2 from second comparator circuit 40 shows a high-level value (S34). If comparison result O2 is a low-level value (N in S34), controlling circuit 50 provides a notification of the faulty open-contact pre-charge contactor (S36), puts pre-charge contactor SW3 into the off state (S38), and ends the procedure.

If comparison result O2 is a high-level value (Y in S34), controlling circuit 50 puts pre-charge contactor SW3 into the off state (S40) and positive-electrode contactor SW1 into the on state (S42), and determines whether comparison result O2 from second comparator circuit 40 shows a high-level value (S44). If comparison result O2 is a low-level value (N in S44), controlling circuit 50 provides a notification of the faulty open-contact positive-electrode contactor (S46), puts positive-electrode contactor SW1 into the off state (S48), and ends the procedure.

If comparison result O2 is a high-level value (Y in S44), controlling circuit 50 puts positive-electrode contactor SW1 into the off state (S50), determines whether or not the pre-charge circuit is faulty (S52), and ends the procedure.

Figure 7:
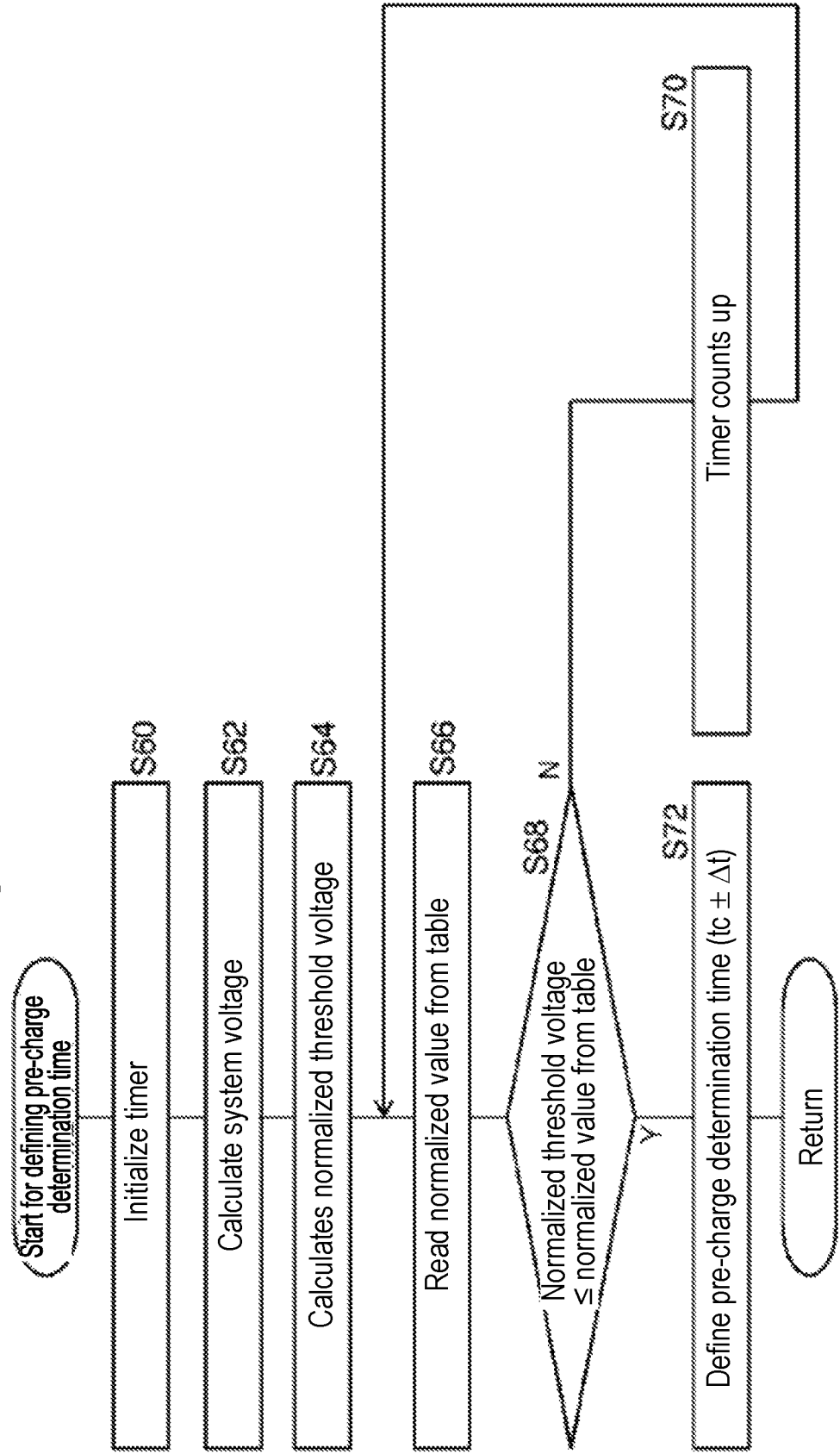
FIG. 7 is a flowchart illustrating a step in FIG. 6 for defining pre-charge determination time.

FIG. 7 is a flowchart illustrating step (S28) in FIG. 6 for defining pre-charge determination time. Controlling circuit 50 initializes a timer (S60), calculates system voltage Vs (S62), calculates a normalized threshold voltage (S64), and reads a normalized value from the table in accordance with a value from the timer (S66). If the normalized threshold voltage is higher than the normalized value from the table (N in S68), controlling circuit 50 lets the timer count up (S70) and returns to step S66. If the normalized threshold voltage is less than or equal to the normalized value from the table (Y in S68), controlling circuit 50 defines pre-charge determination time (tc±Δt) by applying preset time width Δt to time tc, a value from the timer at the instant, and returns to the procedure of FIG. 6.

Figure 8:
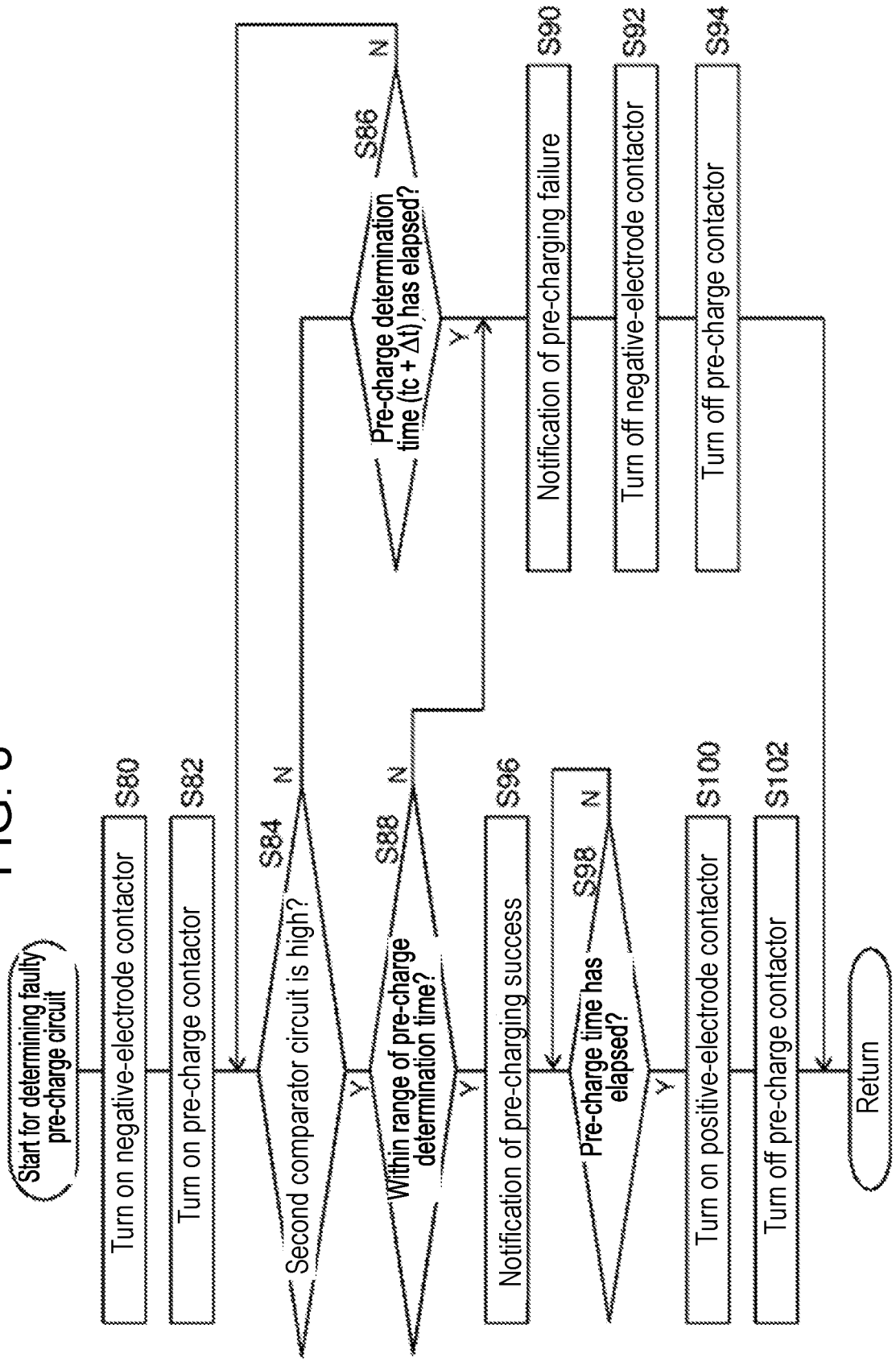
FIG. 8 is a flowchart illustrating a step in FIG. 6 for determining whether or not a pre-charge circuit is faulty.

FIG. 8 is a flowchart illustrating step (S52) in FIG. 6 for determining whether or not the pre-charge circuit is faulty. Controlling circuit 50 puts negative-electrode contactor SW2 into the on state (S80) and pre-charge contactor SW3 into the on state (S82), and determines whether comparison result O2 from second comparator circuit 40 shows a high-level value (S84). If comparison result O2 is a low-level value (N in S84), controlling circuit 50 determines whether longer pre-charge determination time (tc+Δt) has elapsed (S86). If the time has not elapsed (N in S86), controlling circuit 50 returns to step S84. If pre-charge determination time (tc+Δt) has elapsed (Y in S86), controlling circuit 50 provides a notification of pre-charging failure (S90), puts negative-electrode contactor SW2 into the off state (S92) and pre-charge contactor SW3 into the off state (S94), and returns to the procedure of FIG. 6.

If comparison result O2 from second comparator circuit 40 is a high-level value (Y in S84), controlling circuit 50 determines whether a length of time having passed until comparison result O2 reaches a high level after the turning-on of negative-electrode contactor SW2 and pre-charge contactor SW3 is within a range of the pre-charge determination time, i.e. within the limits of tc−Δt to tc+Δt, (S88). If the length of time described above is outside the range of the pre-charge determination time (N in S88), controlling circuit 50 makes a transition to step S90 above. Under this procedure, controlling circuit 50 can determine that the pre-charge circuit is faulty if pre-charging finishes too early or too late. If the length of time described above is within the range of the pre-charge determination time (Y in S88), controlling circuit 50 provides a notification of pre-charging success (S96). Next, controlling circuit 50 determines whether pre-charge time Tp has elapsed (S98). If the time has not elapsed (N in S98), controlling circuit 50 returns to step S98. If pre-charge time Tp has elapsed (Y in S98), controlling circuit 50 puts positive-electrode contactor SW1 into the on state (S100) and pre-charge contactor SW3 into the off state (S102), and returns to the procedure of FIG. 6.

Thus, the power storage system according to the present exemplary embodiment compares first voltage V1 with the first reference voltage, compares second voltage V2 with the second reference voltage, and determines the presence or absence of failure based on whether or not comparison results O1, O2 agree with respective expected values. This eliminates the need for high voltage measurement and thus helps simplify the configuration of circuits. First digital isolator circuit 36 and second digital isolator circuit 46 can be readily built of reasonable circuits, with proviso that the circuits can transmit 1-bit digital data, i.e. comparison results O1, O2.

The power storage system can determine not only the presence or absence of failure in any of positive-electrode contactor SW1, negative-electrode contactor SW2, and pre-charge contactor SW3 but also whether or not pre-charging is properly performed, i.e. the presence or absence of failure in a path of pre-charging made up of pre-charge contactor SW3, resistor R1, and capacitor C1.

As a result, the power storage system can determine the presence or absence of failure while avoiding an increase in cost.

Second Exemplary Embodiment

A second exemplary embodiment differs from the first exemplary embodiment in that a power storage system in the second exemplary embodiment determines the presence or absence of pre-charging failure using second comparator circuit 40 and third comparator circuit 70. Points different from those in the first exemplary embodiment will be primarily described below.

Figure 9:
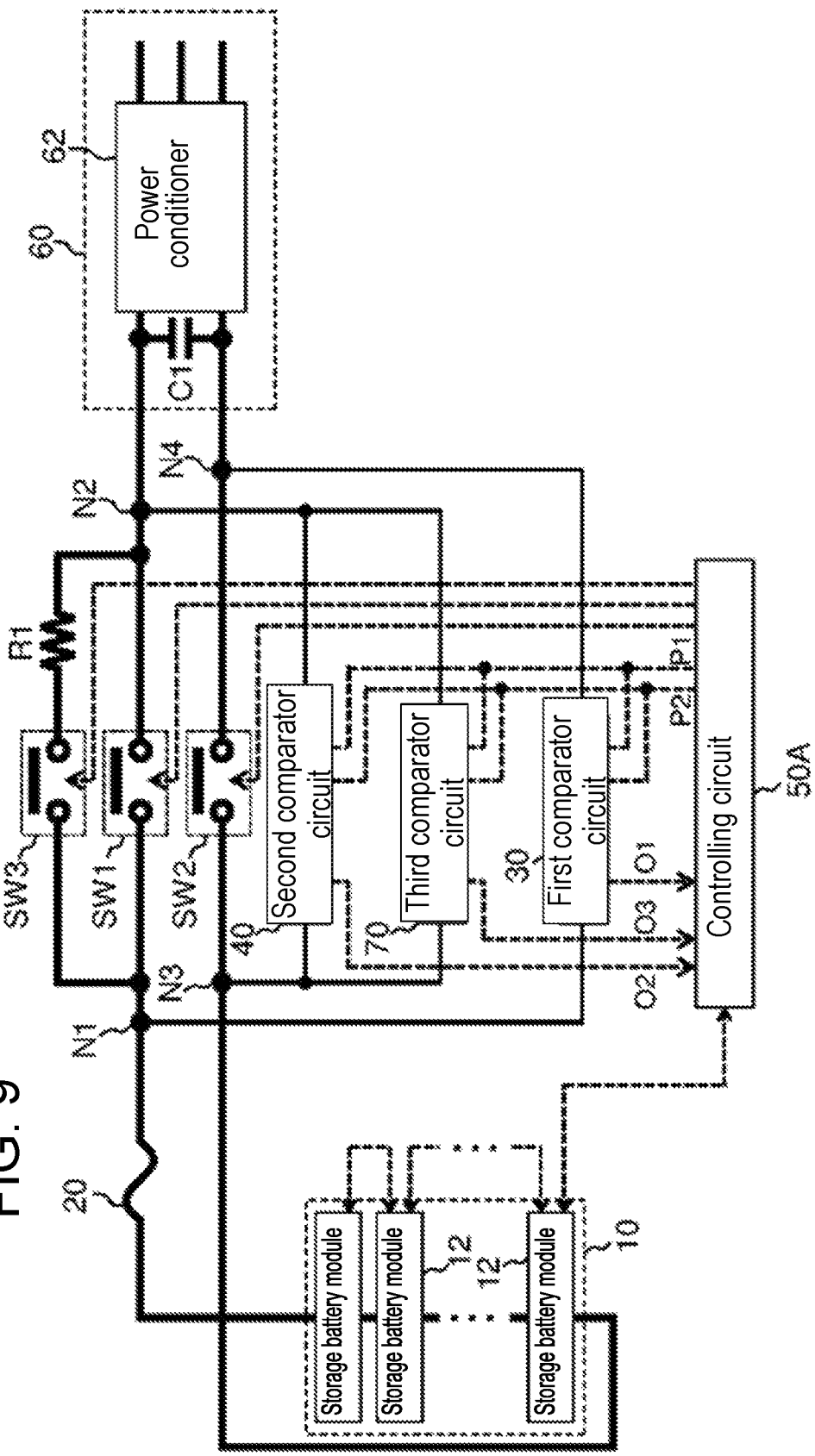
FIG. 9 is a block diagram illustrating a configuration of a power storage system according to a second exemplary embodiment.

FIG. 9 is a block diagram illustrating a configuration of power storage system 1A according to the second exemplary embodiment. Power storage system 1A includes third comparator circuit 70 in addition to the components of the first exemplary embodiment. Controlling circuit 50A differs in functionality from that in the first exemplary embodiment.

Third comparator circuit 70 compares third voltage V3 based on a voltage between second and third nodes N2 and N3 with a third reference voltage that is less than the second reference voltage. Third voltage V3 is a division of the voltage between second and third nodes N2 and N3. Third comparator circuit 70 has a circuit configuration identical to that of second comparator circuit 40 although the comparator circuits compare the respective voltages with different reference voltages. Thus, a description of the internal configuration of third comparator circuit 70 will be omitted.

Controlling circuit 50A defines pre-charge determination time, i.e. a length of time supposed to be taken between the instant when third voltage V3 reaches the third reference voltage after turning-on of negative-electrode contactor SW2 and pre-charge contactor SW3 and the instant when second voltage V2 reaches the second reference voltage, on the basis of a detection voltage on power storage unit 10, the second reference voltage, the third reference voltage, resistor R1, and capacitor C1.

Controlling circuit 50A determines whether or not pre-charging is properly performed based on a length of time having passed until second voltage V2 reaches the second reference voltage after third voltage V3 reaches the third reference voltage following the turning-off of positive-electrode contactor SW1 and the turning-on of negative-electrode contactor SW2 and pre-charge contactor SW3, as well as the pre-charge determination time.

Figure 10:
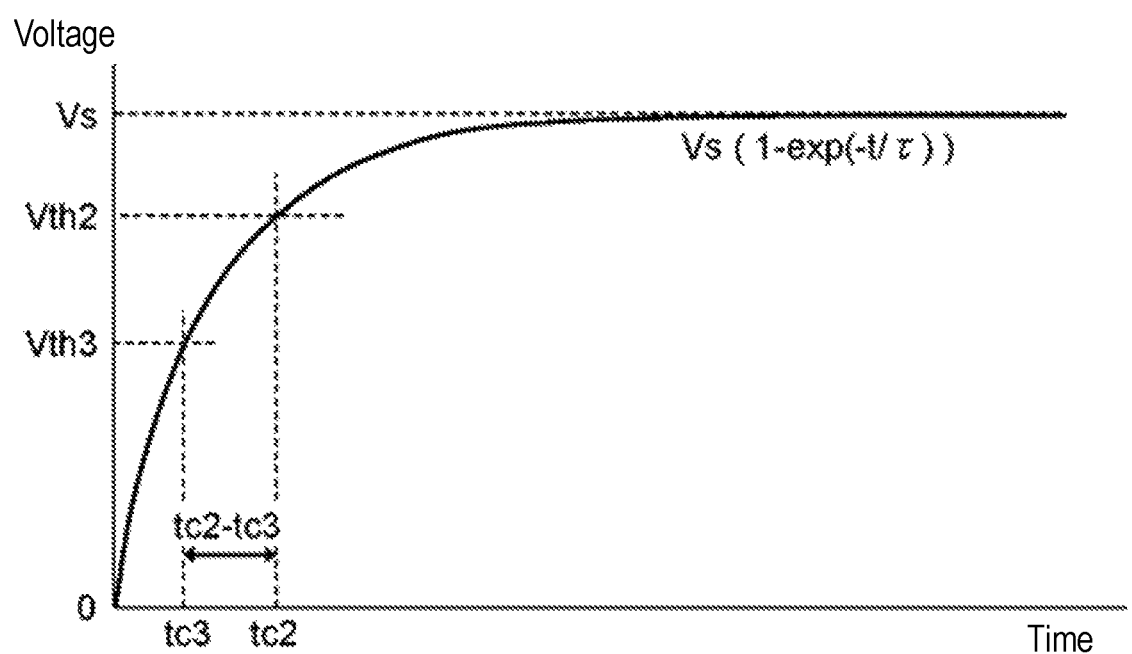
FIG. 10 is a graph illustrating changes in voltage at a second node in FIG. 9 over time during pre-charging.

FIG. 10 is a graph illustrating changes in voltage at second node N2 in FIG. 9 over time during pre-charging. A waveform in FIG. 10 is the same as the waveform in FIG. 5. If pre-charging is properly performed, time taken for second voltage V2, a divided voltage, to reach the second reference voltage equals time taken for the voltage at second node N2 to reach second threshold voltage Vth2 corresponding to the second reference voltage. Time taken for third voltage V3, a divided voltage, to reach the third reference voltage equals time taken for the voltage at second node N2 to reach third threshold voltage Vth3 corresponding to the third reference voltage. Accordingly, the power storage system calculates second determination time tc2 taken for the voltage at second node N2 to reach second threshold voltage Vth2 and third determination time tc3 taken for the voltage at second node N2 to reach third threshold voltage Vth3.

Controlling circuit 50A calculates a second normalized threshold voltage, that is a value obtained by dividing second threshold voltage Vth2 by system voltage Vs, and a third normalized threshold voltage, that is a value obtained by dividing third threshold voltage Vth3 by system voltage Vs. Controlling circuit 50A retrieves a normalized value near the second normalized threshold voltage from the table and defines time corresponding to the normalized value retrieved from the table as second determination time tc2. Controlling circuit 50A retrieves a normalized value near the third normalized threshold voltage from the table and defines time corresponding to the normalized value retrieved from the table as third determination time tc3. Controlling circuit 50A defines pre-charge determination time {(tc2−tc3)±Δti} by applying preset time width Δti to a difference between second determination time tc2 and third determination time tc3. The difference between second determination time tc2 and third determination time tc3 does not vary even if capacitor C1 stores electric charges at the start of pre-charging.

A course of action performed by power storage system 1A is basically similar to the procedure of the flowchart in FIG. 6 in the first exemplary embodiment except for processes in steps S28 and S52 as described below.

Figure 11:
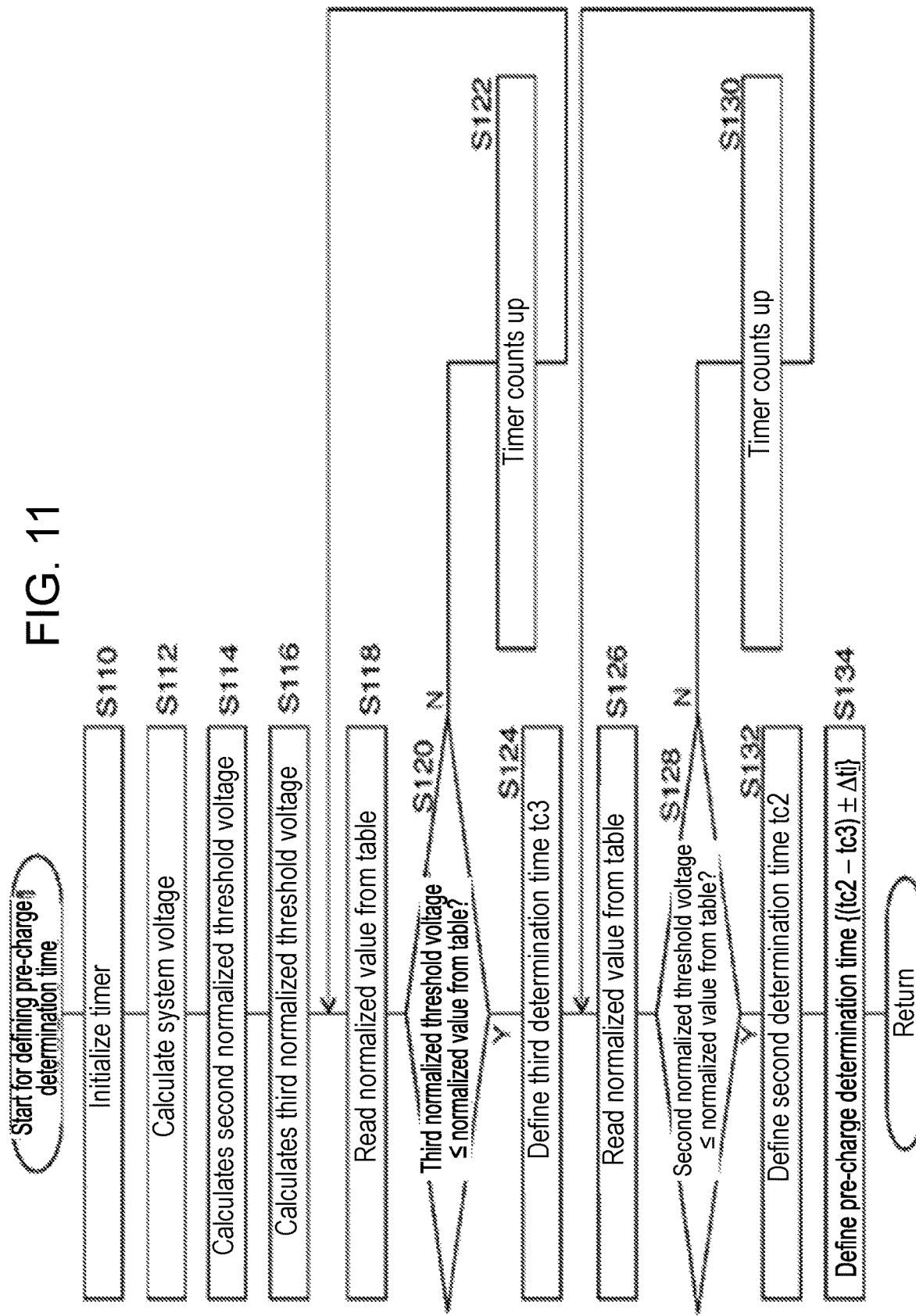
FIG. 11 is a flowchart illustrating a step for defining pre-charge determination time according to the second exemplary embodiment.

FIG. 11 is a flowchart illustrating step (S28) for defining pre-charge determination time according to the second exemplary embodiment.

Controlling circuit 50A initializes a timer (S110), calculates the system voltage (S112), calculates a second normalized threshold voltage (S114), and calculates a third normalized threshold voltage (S116).

Controlling circuit 50A reads a normalized value from the table in accordance with a value from the timer (S118). If the third normalized threshold voltage is higher than the normalized value from the table (N in S120), controlling circuit 50A lets the timer count up (S122) and returns to step S118. If the third normalized threshold voltage is less than or equal to the normalized value from the table (Y in S120), controlling circuit 50A defines the value from the timer at the instant as third determination time tc3.

Next, controlling circuit 50A reads a normalized value from the table in accordance with a value from the timer (S126). If the second normalized threshold voltage is higher than the normalized value from the table (N in S128), controlling circuit 50A lets the timer count up (S130) and returns to step S126. If the second normalized threshold voltage is less than or equal to the normalized value from the table (Y in S128), controlling circuit 50A defines the value from the timer at the instant as second determination time tc2. Controlling circuit 50A defines pre-charge determination time {(tc2−tc3)±Δti} (S134) and returns to the procedure of FIG. 6.

Steps S126 to S132 may take place before steps S118 to S124. In this case, the timer is initialized between steps S132 and S118.

Figure 12:
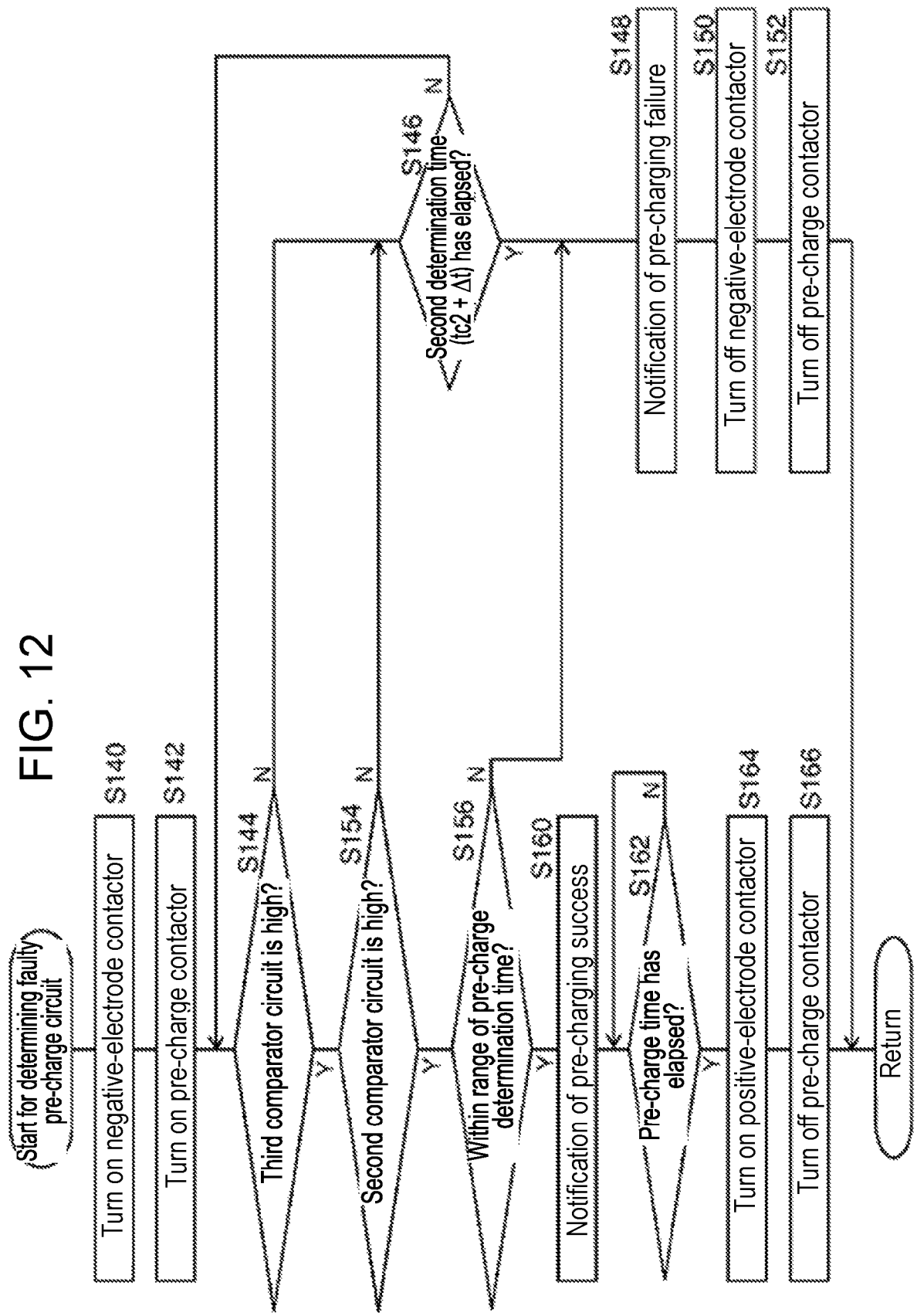
FIG. 12 is a flowchart illustrating a step for determining whether or not a pre-charge circuit is faulty according to the second exemplary embodiment.

FIG. 12 is a flowchart illustrating step (S52) for determining whether or not the pre-charge circuit is faulty according to the second exemplary embodiment. Controlling circuit 50A puts negative-electrode contactor SW2 into the on state (S140) and pre-charge contactor SW3 into the on state (S142), and determines whether comparison result O3 from third comparator circuit 70 shows a high-level value (S144). If comparison result O3 is a low-level value (N in S144), controlling circuit 50A determines whether second determination time (tc2+Δt) has elapsed (S146). If the time has not elapsed (N in S146), controlling circuit 50A returns to step S144. If second determination time (tc2+Δt) has elapsed (Y in S146), controlling circuit 50A provides a notification of pre-charging failure (S148), puts negative-electrode contactor SW2 into the off state (S150) and pre-charge contactor SW3 into the off state (S152), and returns to the procedure of FIG. 6.

If comparison result O3 from third comparator circuit 70 is a high-level value (Y in S144), controlling circuit 50A determines whether comparison result O2 from second comparator circuit 40 shows a high-level value (S154). If comparison result O2 is a low-level value (N in S154), controlling circuit 50A makes a transition to step S146. If comparison result O2 from second comparator circuit 40 is a high-level value (Y in S154), controlling circuit 50A determines whether a length of time having passed until comparison result O2 reached a high level after comparison result O3 reaches a high level is within a range of the pre-charge determination time, i.e. within the limits of (tc2−tc3)−Δti to (tc2−tc3)+Δti, (S156). If the length of time described above is outside the range of the pre-charge determination time (N in S156), controlling circuit 50A makes a transition to step S148 above. Under this procedure, controlling circuit 50A can determine that the pre-charge circuit is faulty if pre-charging finishes too early or too late. If the length of time described above is within the range of the pre-charge determination time (Y in S156), controlling circuit 50A provides a notification of pre-charging success (S160).

Next, controlling circuit 50A determines whether pre-charge time Tp has elapsed (S162). If the time has not elapsed (N in S162), controlling circuit 50A returns to step S162. If pre-charge time Tp has elapsed (Y in S162), controlling circuit 50A puts positive-electrode contactor SW1 into the on state (S164) and pre-charge contactor SW3 into the off state (S166), and returns to the procedure of FIG. 6.

Thus, the power storage system according to the present exemplary embodiment determines whether or not pre-charging is properly performed based on the pre-charge determination time associated with a difference between second determination time tc2 and third determination time tc3. As a result, the power storage system can make a determination with improved accuracy even if capacitor C1 stores electric charges at the start of pre-charging. The power storage system can also produce effects shown in the first exemplary embodiment.

The present invention has been described based on the exemplary embodiments. A person of ordinary skill in the art can understand that the exemplary embodiments are illustrative only, constitution elements and combined processing processes can be modified in various manners, and such modified examples are covered by the scope of the present invention.

In the first and second exemplary embodiments described above, power storage systems 1, 1A are in-vehicle systems, for example. In this respect, power storage systems 1, 1A may be used as stationary systems. Battery cells included in power storage unit 10 may be replaced by capacitors such as electric double layer capacitors or lithium-ion capacitors.

In the first and second exemplary embodiments, step (S28) in FIG. 6 for defining pre-charge determination time may take place at any desired timing, with proviso that the step comes before step (S52) for determining whether or not the pre-charge circuit is faulty.

The first exemplary embodiment may have an additional third comparator circuit that compares a third voltage based on the voltage between second and third nodes N2 and N3 with a third reference voltage that is less than the second reference voltage. Then, controlling circuit 50 may refer to a comparison result from the third comparator circuit, and then take the step for determining whether or not the pre-charge circuit is faulty if the voltage at second node N2 is less than or equal to a predetermined value closer to 0 V and not take the step for determining whether or not the pre-charge circuit is faulty if the voltage at second node N2 is higher than the predetermined value. Under this procedure, the controlling circuit can provide further increased determination accuracy.

The second exemplary embodiment may have an additional fourth comparator circuit that compares a fourth voltage based on the voltage between second and third nodes N2 and N3 with a fourth reference voltage that is different from the second and third reference voltages. Then, the controlling circuit may determine whether or not pre-charging is properly performed based on pre-charge determination time associated with the fourth reference voltage, as well as another pre-charge determination time. Under this procedure, the controlling circuit can provide further increased determination accuracy.

The exemplary embodiments may be specified by items described below:

[Item 1]

Power storage system (1, 1A) including:

power storage unit (10);

first switch (SW1) connected between first node (N1) and second node (N2), first node (N1) being connected to a positive terminal of power storage unit (10), and second node (N2) being connected to a positive terminal of load (60);

second switch (SW2) connected between third node (N3) and fourth node (N4), third node (N3) being connected to a negative terminal of power storage unit (10), and fourth node (N4) being connected to a negative terminal of load (60);

first comparator circuit (30) that compares first voltage (V1) based on a voltage between first and fourth nodes (N1) and (N4) with a first reference voltage; and second comparator circuit (40) that compares second voltage (V2) based on a voltage between second and third nodes (N2) and (N3) with a second reference voltage.

Thus, the power storage system can determine the presence or absence of failure while avoiding an increase in cost.

[Item 2]
Power storage system (1, 1A) according to item 1, further including fuse (20) connected between the positive terminal of power storage unit (10) and first node (N1).

Thus, the power storage system can determine whether or not fuse (20) is disconnected.

[Item 3]
Power storage system (1, 1A) according to item 1 or 2, further including controlling circuit (50, 50A) that controls first switch (SW1) and second switch (SW2) and determines presence or absence of failure in each of first and second switches (SW1) and (SW2) based on whether or not comparison result (O1) from first comparator circuit (30) and comparison result (O2) from second comparator circuit (40) agree with respective expected values.

Thus, the power storage system can readily determine the presence or absence of failure.

[Item 4]
Power storage system (1, 1A) according to item 3,
wherein first switch (SW1) and second switch (SW2) are contactors, and
wherein controlling circuit (50, 50A) puts first and second switches (SW1) and (SW2) into an off state, and determines that second switch (SW2) is welded in accordance with comparison result (O1) from first comparator circuit (30) and determines that first switch (SW1) is welded in accordance with comparison result (O2) from second comparator circuit (40).

Thus, the power storage system can determine presence or absence of weld failure in each of first and second switches (SW1) and (SW2).

[Item 5]
Power storage system (1, 1A) according to item 4,
wherein controlling circuit (50, 50A) puts first switch (SW1) into the off state and second switch (SW2) into an on state, and determines that second switch (SW2) is in an open-contact failure in accordance with comparison result (O1) from first comparator circuit (30), and
wherein controlling circuit (50, 50A) puts first switch (SW1) into the on state and second switch (SW2) into the off state, and determines that first switch (SW1) is in an open-contact failure in accordance with comparison result (O2) from second comparator circuit (40).

Thus, the power storage system can determine presence or absence of failure to turn on each of first and second switches (SW1) and (SW2).

[Item 6]
Power storage system (1, 1A) according to any one of items 3 to 5, further including:
third switch (SW3) being disposed between first and second nodes (N1) and (N2) and being connected in parallel with first switch (SW1); and
resistor (R1) being disposed between first and second nodes (N1) and (N2) and being connected in series with third switch (SW3).

Thus, the power storage system can determine presence or absence of failure in third switch (SW3) and resistor (R1).

[Item 7]
Power storage system (1) according to item 6,
wherein load (60) includes capacitor (C1) connected between second and fourth nodes (N2) and (N4),
wherein controlling circuit (50) defines a length of time supposed to be taken between an instant when second switch (SW2) and third switch (SW3) are turned on and an instant when second voltage (V2) reaches the second reference voltage, based on a detection voltage on power storage unit (10) and the second reference voltage, and wherein controlling circuit (50) determine whether or not pre-charging is properly performed on capacitor (C1) based on a length of time having passed until second voltage (V2) reaches the second reference voltage after turning-on of second and third switches (SW2) and (SW3), as well as the length of time supposed to be taken.

Thus, the power storage system can determine whether or not pre-charging is properly performed.

[Item 8]
Power storage system (1A) according to item 6, further including third comparator circuit (70) that compares third voltage (V3) based on the voltage between second and third nodes (N2) and (N3) with a third reference voltage that is less than the second reference voltage,
wherein load (60) includes capacitor (C1) connected between second and fourth nodes (N2) and (N4),
wherein controlling circuit (50A) defines a length of time supposed to be taken between an instant when third voltage (V3) reaches the third reference voltage after turning-on of second and third switches (SW2) and (SW3) and an instant when second voltage (V2) reaches the second reference voltage, based on a detection voltage on power storage unit (10), the second reference voltage, and the third reference voltage, and
wherein controlling circuit (50A) determines whether or not pre-charging is properly performed on capacitor (C1) based on a length of time having passed until second voltage (V2) reaches the second reference voltage after third voltage (V3) reaches the third reference voltage following turning-on of second and third switches (SW2) and (SW3), as well as the length of time supposed to be taken.

Thus, the power storage system can determine whether or not pre-charging is properly performed with improved accuracy even if capacitor (C1) stores electric charges at the start of pre-charging.

The invention claimed is:
1. A power storage system comprising:
a power storage unit;
a first switch connected between a first node and a second node, the first node being connected to a positive terminal of the power storage unit, and the second node being connected to a positive terminal of a load;
a second switch connected between a third node and a fourth node, the third node being connected to a negative terminal of the power storage unit, and the fourth node being connected to a negative terminal of the load;
a first comparator circuit that compares a first voltage based on a voltage between the first and the fourth nodes with a first reference voltage;
a second comparator circuit that compares a second voltage based on a voltage between the second and the third nodes with a second reference voltage, and
a controlling circuit that controls the first switch and the second switch and determines presence or absence of failure in each of the first and the second switches based on whether or not a comparison result from the first comparator circuit and a comparison result from the second comparator circuit agree with respective expected values,
wherein the first switch and the second switch are contactors,
wherein the controlling circuit puts the first and the second switches into an off state, and determines that the second switch is welded in accordance with a comparison result from the first comparator circuit and determines that the first switch is welded in accordance with a comparison result from the second comparator circuit, wherein the controlling circuit puts the first switch into the off state and the second switch into an on state, and determines that the second switch is in an open-contact failure in accordance with a comparison result from the first comparator circuit, and wherein the controlling circuit puts the first switch into the on state and the second switch into the off state, and determines that the first switch is in an open-contact failure in accordance with a comparison result from the second comparator circuit.

2. The power storage system according to claim 1, further comprising a fuse connected between the positive terminal of the power storage unit and the first node.

3. The power storage system according to claim 1, further comprising:
- a third switch being disposed between the first and the second nodes and being connected in parallel with the first switch; and
- a resistor being disposed between the first and the second nodes and being connected in series with the third switch.

4. The power storage system according to claim 3,
wherein the load includes a capacitor connected between the second and the fourth nodes,
wherein the controlling circuit defines a length of time supposed to be taken between an instant when the second switch and the third switch are turned on and an instant when the second voltage reaches the second reference voltage, based on a detection voltage on the power storage unit and the second reference voltage, and
wherein the controlling circuit determines whether or not pre-charging is properly performed on the capacitor based on a length of time having passed until the second voltage reaches the second reference voltage after turning-on of the second and the third switches, as well as the length of time supposed to be taken.

5. The power storage system according to claim 3, further comprising a third comparator circuit that compares a third voltage based on the voltage between the second and the third nodes with a third reference voltage that is less than the second reference voltage,
wherein the load includes a capacitor connected between the second and the fourth nodes,
wherein the controlling circuit defines a length of time supposed to be taken between an instant when the third voltage reaches the third reference voltage after turning-on of the second and the third switches and an instant when the second voltage reaches the second reference voltage, based on a detection voltage on the power storage unit, the second reference voltage, and the third reference voltage, and
wherein the controlling circuit determines whether or not pre-charging is properly performed on the capacitor based on a length of time having passed until the second voltage reaches the second reference voltage after the third voltage reaches the third reference voltage following turning-on of the second and the third switches, as well as the length of time supposed to be taken.

* * * * *